United States Patent
Baumgartner et al.

(10) Patent No.: US 7,260,799 B2
(45) Date of Patent: Aug. 21, 2007

(54) EXPLOITING SUSPECTED REDUNDANCY FOR ENHANCED DESIGN VERIFICATION

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 11/054,904

(22) Filed: Feb. 10, 2005

(65) Prior Publication Data

US 2006/0190873 A1   Aug. 24, 2006

(51) Int. Cl.
  *G06F 17/50* (2006.01)
(52) U.S. Cl. .......... 716/5; 716/4; 703/14; 703/15
(58) Field of Classification Search .......... 716/4–6; 703/14–15
  See application file for complete search history.

(56) References Cited

U.S. PATENT DOCUMENTS

| | | | | |
|---|---|---|---|---|
| 5,477,474 A | * | 12/1995 | Southgate et al. | 703/15 |
| 6,026,222 A | * | 2/2000 | Gupta et al. | 716/5 |
| 6,086,626 A | * | 7/2000 | Jain et al. | 716/5 |
| 6,195,776 B1 | * | 2/2001 | Ruiz et al. | 714/738 |
| 6,247,165 B1 | * | 6/2001 | Wohl et al. | 716/5 |
| 6,301,687 B1 | * | 10/2001 | Jain et al. | 716/3 |
| 6,308,299 B1 | * | 10/2001 | Burch et al. | 716/4 |
| 6,687,882 B1 | * | 2/2004 | McElvain et al. | 716/3 |
| 6,698,003 B2 | | 2/2004 | Baumgartner et al. | |
| 6,714,902 B1 | * | 3/2004 | Chao et al. | 703/14 |
| 2006/0122817 A1 | * | 6/2006 | Baumgartner et al. | 703/14 |

OTHER PUBLICATIONS

Bjesse, P., et al., SAT-Based Verification without State Space Traversal, FMCAD 2000, LNCS 1954, pp. 372-389, Springer-Verlag Berlin Heidelberg 2000.
Van Eijk, C.A.J., Sequential Equivalence Checking without State Space Traversal, Proceedings of Design, Automation and Testing in Europe, Feb. 1998, IEEE Computer Society, Los Alamitos, California.

* cited by examiner

*Primary Examiner*—Vuthe Siek
*Assistant Examiner*—Naum Levin
(74) *Attorney, Agent, or Firm*—Cas Salys; Anthony V. S. England

(57) ABSTRACT

A verification method foe an integrated circuit includes identifying an equivalence class including a set of candidate gates suspected of exhibiting equivalent behavior and identifying one of the candidate gates as a representative gate for the equivalence class. Equivalence gates of an XOR gate are sourced by the representative gate and a candidate gate. A speculatively reduced netlist is generated by replacing the representative gate as the source gate for edges sourced by a candidate gate in the original design. The speculatively reduced netlist is then used either to verify formally the equivalence of the gates by applying a plurality of transformation engines to the speculatively reduced netlist or to perform incomplete search and, if none of the equivalence gates is asserted during the incomplete search, any verification results derived from the incomplete search can be applied to the original model.

20 Claims, 6 Drawing Sheets

EXPLOITING SUSPECTED REDUNDANCY FOR ENHANCED DESIGN VERIFICATION

BACKGROUND

1. Field of the Present Invention

The present invention is in the field of integrated circuit design and, more particularly, systems and methods for design verification.

2. History of Related Art

In the field of integrated circuit design, formal verification refers to the process of rigorously proving that a design satisfies its specification. Typically, the specification of a verification problem includes a netlist-based representation of the design and a set of expected values for specified nets. As an example, a verification problem may include determining whether a state exists in which a CHECKSTOP signal is asserted, where an asserted CHECKSTOP signal indicates a fault. Using formal verification, one either finds a counterexample trace depicting a sequence of values of the nets over time, similar to a simulation trace, that leads to an assertion of the CHECKSTOP signal or proves that no such trace exists.

Formal verification is often performed using state space search algorithms. Such algorithms include unbounded and bounded exhaustive searches. Bounded exhaustive searches try to find an assertion of CHECKSTOP that can occur within N time steps from an initial state of the design. Unbounded exhaustive algorithms increase N until no states are encountered that have not already been encountered for smaller values of N (a condition termed "fixed-point"). If no path from an initial state to a violating state (a state in which CHECKSTOP is asserted) is encountered before fixed-point is reached, then correctness can be inferred.

The number of verification cycles required to perform an exhaustive state space search increases exponentially with the number of state holding elements or registers. This exponential relationship makes it highly desirable to reduce the number of elements in a design model. One well-known technique for reducing or simplifying a model is to eliminate redundancy. Redundancy refers to elements of the design model that exhibit identical behavior. If redundant elements can be established, the model can be simplified by replacing multiple elements with a single element. One type of redundancy removal is referred to as sequential redundancy removal because it operates on a sequential model of the design.

Conventional sequential redundancy removal begins by proposing a set of elements thought to be equivalent. Thereafter, conventional sequential redundancy removal attempts to prove formally that the proposed elements are equivalent. This proof is traditionally attempted using a fixed-point iteration, such as enumerating all reachable states of the design—which tends to be prohibitively expensive—or by using an approximate approach such as induction.

In common inductive methods, the design is effectively initialized into any arbitrary state where all of the proposed equivalent elements have the same value (either be 0 or 1). Inductive methods then attempt to demonstrate that each of the proposed elements remain equivalent one time step from the initial state. More generally, k-step induction includes placing the design into any arbitrary initial state, with the constraint that the suspected equivalent elements are equivalent for the initial states and all states transitioned to within k−1 time steps, and then verifying that the set of states transitioned to in k steps also satisfy the suspected equivalence relation. Skilled practitioners will appreciate that induction algorithms are resource intensive. Moreover, induction algorithms are "weak" in the sense that they cannot differentiate between assertions of a target associated with an unreachable state and other assertions of the target.

It would be desirable to implement a sequential redundancy removal process that is at least as robust as existing methodologies, but does not required the resources associated with induction and reachability algorithms. Moreover, conventional verification algorithms do not attempt to make good use of suspected redundancy until equivalence is formally proven. It would be desirable to implement a verification method that was able to obtain meaningful verification information using suspected, but unproven, redundancy.

SUMMARY OF THE INVENTION

The present invention achieves the identified objectives with an integrated circuit design verification method and system. The method includes identifying an equivalence class including a set of candidate gates suspected of exhibiting equivalent behavior. One of the candidate gates is identified as a representative gate for the equivalence class. Equivalence targets are added to the netlist by XORing each candidate gate with the representative gate. A speculatively reduced netlist is generated by inserting the representative gate as the source gate for edges sourced by a candidate gate in the original design.

The speculatively reduced netlist is then used either to verify formally the equivalence of the gates by applying a plurality of transformation engines to the speculatively reduced netlist or to perform incomplete search and, if none of the equivalence gates is asserted during the incomplete search, applying any verification results achieved with the incomplete search to the original model. Identifying one of the candidate gates as the representative gate may include assigning a level to each candidate gate, based on certain specified rules, and selecting the gate having the lowest level as the representative. Applying the plurality of transformation engines may include applying an engine selected from a retiming engine, a localization engine, and a parametric re-encoding engine. The invention may apply different combinations or sequences of transformation engines to discharge different equivalence targets.

BRIEF DESCRIPTION OF THE DRAWINGS

Other objects and advantages of the invention will become apparent upon reading the following detailed description and upon reference to the accompanying drawings in which.

Figure 1:
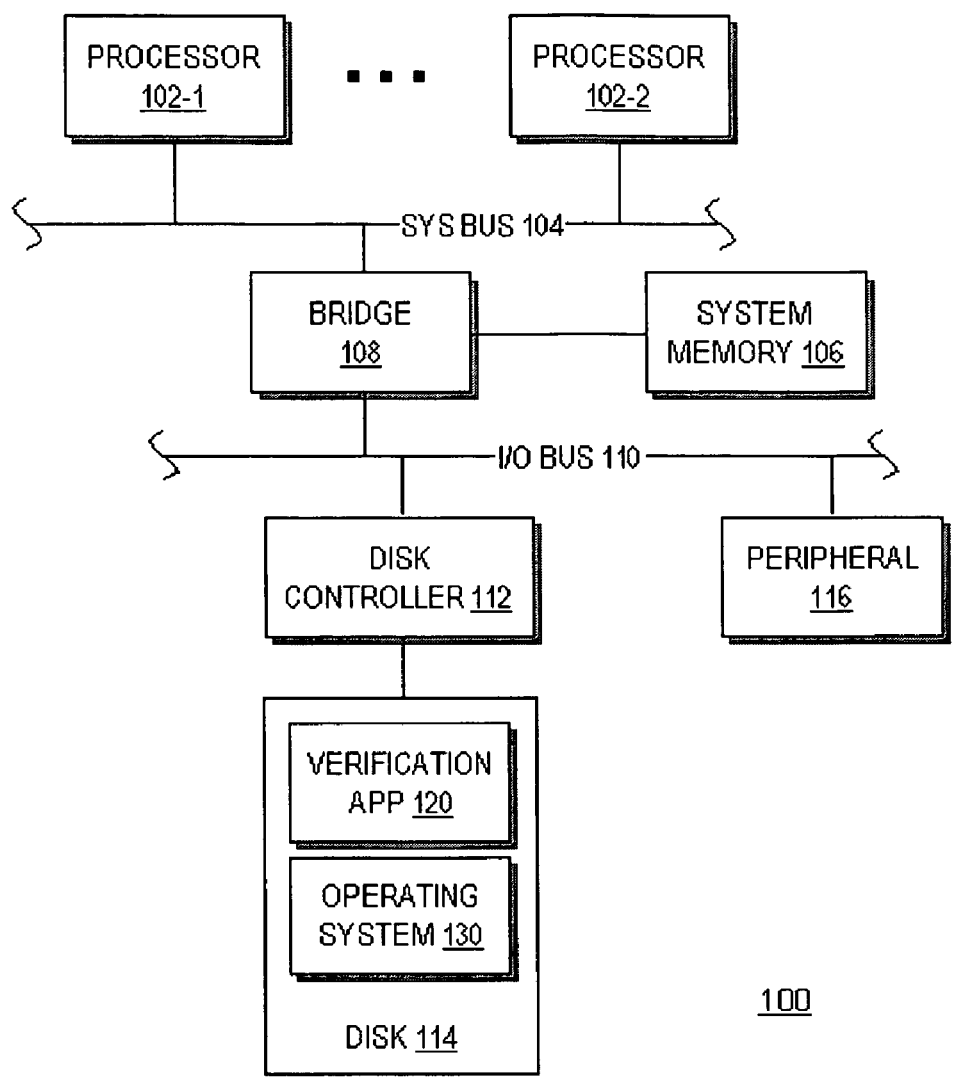
FIG. 1 is a block diagram of selected elements of a data processing system according to an embodiment of the present invention.

While the invention is susceptible to various modifications and alternative forms, the drawings show specific embodiments of the invention that this disclosure will describe in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF AN EMBODIMENT OF THE INVENTION

Generally speaking, the invention encompasses a system and method for identifying suspected redundancy in the model of an integrated circuit and then using the suspected redundancy to further the formal verification process. The verification method may include formally proving that the gates in a proposed equivalence class are equivalent (redundant) so that the redundant elements can be merged to simplify the model. Alternatively, the verification method may include using the suspected redundancy, without actually proving equivalence of a proposed equivalence class, to perform additional verification.

The verification system and method operate on a model of an integrated circuit design. The model illustrated in this disclosure is a netlist that includes gates and edges. Edges represent interconnections between gates so that, for example, an edge connects a source gate to a sink gate. In the embodiment of concern in this disclosure, a gate falls into one of one of four broad functional categories, namely, constant gates, random gates, combinational gates, and sequential gates. A constant gate produces a logical level that does not vary with time. A random gate, also referred to as a primary input, may assume any logical level in any time step independent of all other gates. A combinational gate is a logical element such as an AND gate. A sequential gate is also known to as a register gate or simply a register. A register has two components associated with it, namely, an initial value function, and a next state function. The value of a register for time 0 is the value of the initial value function at time 0 while the value of a register at time "i+1" is equal to the value of its next state function at time "i."

Initially, the verification method including proposes one or more equivalence classes using, as an example, random simulation in conjunction with formal or semi-formal analysis, to identify gates that exhibit a common signature (as well as gates that exhibit the logical inverse of the common signature). After proposing equivalence classes, the method selects one of the gates in an equivalence class as the class's representative gate. The remaining gates in an equivalence class are referred to herein as candidate gates or simply candidates.

A speculatively reduced netlist of the design is then generated by identifying all edges in the original net list that are sourced by a candidate and replacing the source gate on each of the identified edges with the representative gate. In addition, a set of targets, referred to herein as equivalence targets, are constructed for each candidate gate. For suspected gates that exhibit behavior that is identical to the representative, the equivalence target is the XOR of the candidate and the representative. (Candidates that exhibit inverted behavior with respect to the representative require an XNOR equivalence target).

The system and method may use the speculatively reduced netlist for two distinct purposes. First, the speculatively reduced netlist facilitates formal establishment of the equivalence classes. In this application, applying a series of transformation engines to the speculatively reduced netlist simplifies formal proof of equivalence. Second, the system uses the speculatively reduce netlist as the basis for performing additional verification without formally establishing that the gates in an equivalence class are, in fact, equivalent. This application includes using the equivalence targets as filters. For example, simulation of the speculatively reduced netlist model is valid for all time steps occurring before the assertion of any equivalence target. In either application, detection of an asserted equivalence target can result in a refinement of the equivalence classes and an additional verification cycle.

In some embodiments, the invention is a data processing system having sequential redundancy removal functionality. Referring to FIG. 1, the block diagram depicts selected elements of a data processing system 100 suitable for implementing sequential redundancy removal functionality according to the present invention. In the depicted embodiment, system 100 includes general purpose processors 102-1 and 102-2 (generically or collectively referred to herein as processor(s) 102). The number of processors is implementation specific and other embodiments may have more or fewer processors 102.

Processors 102 share access to a high-speed system bus 104. A bus bridge 108 provides an interface between system bus 104 and a shared peripheral bus 110. Bus bridge 108 as depicted in FIG. 1 also includes memory control functionality and provides an interface between system bus 104 and a system memory 106. System memory 106 is most likely a volatile storage medium such as a relatively large array of DRAM elements. Peripheral bus 110 may be implemented as an industry standard peripheral bus such as a PCI (peripheral components interface) or PCI-X bus.

A disk controller 112 connected to peripheral bus 110 provides an interface to a hard disk 114. Disk 114 may store data and instructions used by processors 102. In the depicted embodiment, the instructions stored on disk 114 include an operating system 130 and a sequential redundancy removal application 120 according to the present invention. Operating system 130 may be a commercially distributed operating system such as a Unix-based operating system, a Linux operating system, or a Windows® family operating system from Microsoft Corporation.

The depicted embodiment of system 100 may include one or more additional peripheral devices represented by peripheral 116. Peripheral 116 may represent a network communication device (e.g., a network interface card) coupling system 100 to a network, a graphics adapter providing graphic display capabilities to system 100, or a number of other well known peripheral devices. The depicted embodiment of system 100 is a specific implementation and other system may include additional elements, fewer elements, a different architecture, and so forth. For example, other embodiments of system 100 may include only a single processor or multiple processors that do not connect to a common bus. Similarly, system memory 110 may be distributed among different nodes with each processor having local access to a portion of the distributed memory and remote access to the remaining portions of system memory via an interconnect fabric.

As suggested in the preceding description, sequential redundancy removal application 120 may be implemented as a set or sequence of computer executable instructions, stored on a computer readable medium, for verifying that a design meets its specification and for identifying redundancy in a netlist of the design. The instructions may be stored on a persistent storage medium such as hard disk 114, a CD ROM (not depicted), floppy diskette (not depicted), magnetic tape (not depicted), and the like. The instructions may also be stored on a volatile storage medium such as system memory 106 or a cache memory (not depicted) of data processing system 100.

Figure 2:
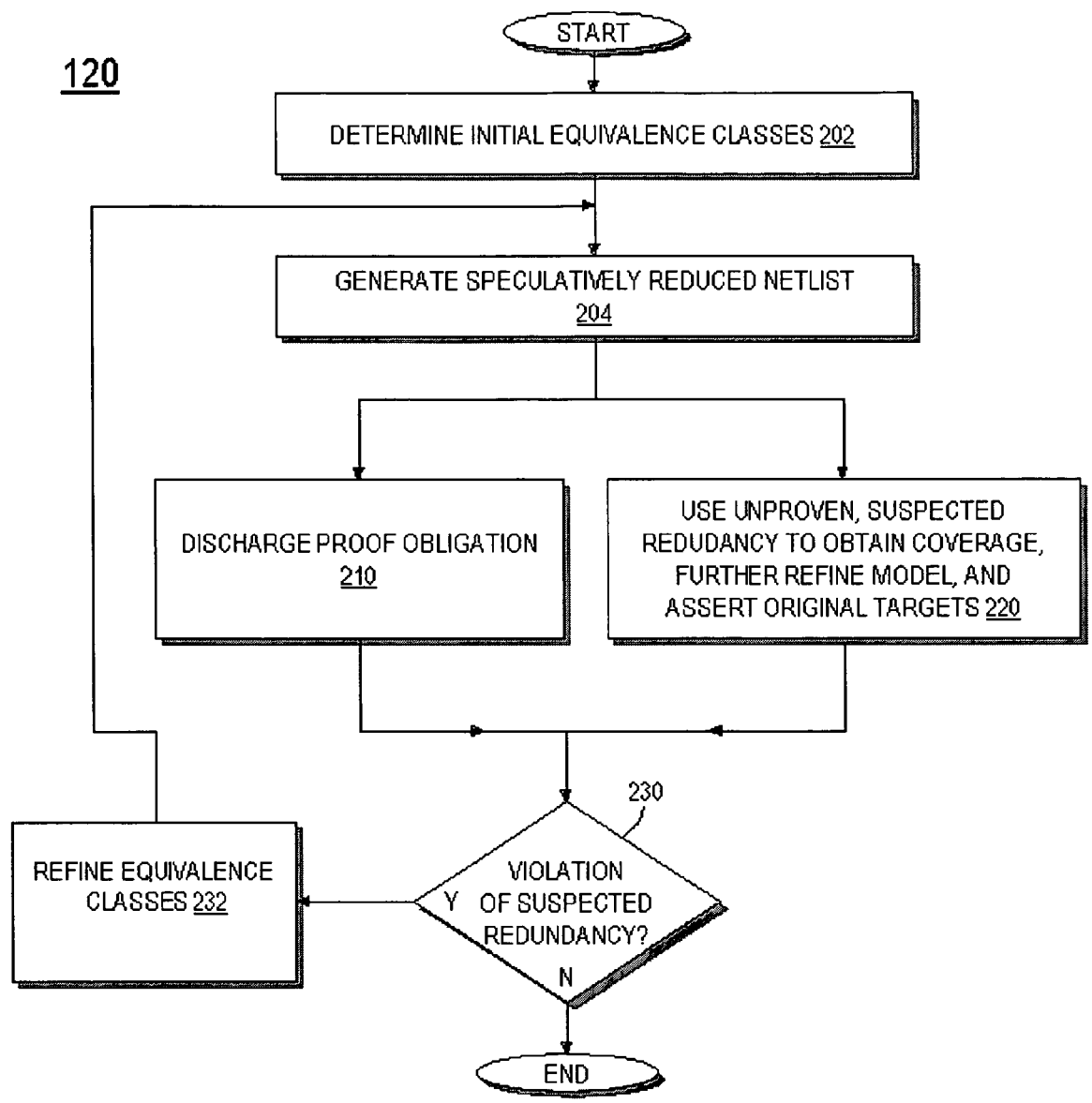
FIG. 2 is a flow diagram of a design sequential redundancy removal application according to one embodiment of the present invention.

Referring now to FIG. 2, a flow diagram depicts selected elements of a sequential redundancy removal application 120 according to one embodiment of the present invention. In the depicted embodiment, sequential redundancy removal 120 begins by determining (block 202) one or more proposed equivalence classes. An equivalence class is a set of gates in the netlist suspected of being equivalent or redundant. Determining the equivalence classes is achievable using multiple techniques including random simulation, symbolic simulation to perform multiple simulation runs in parallel, using name-based or structure-based comparisons, and so forth.

Figure 3:
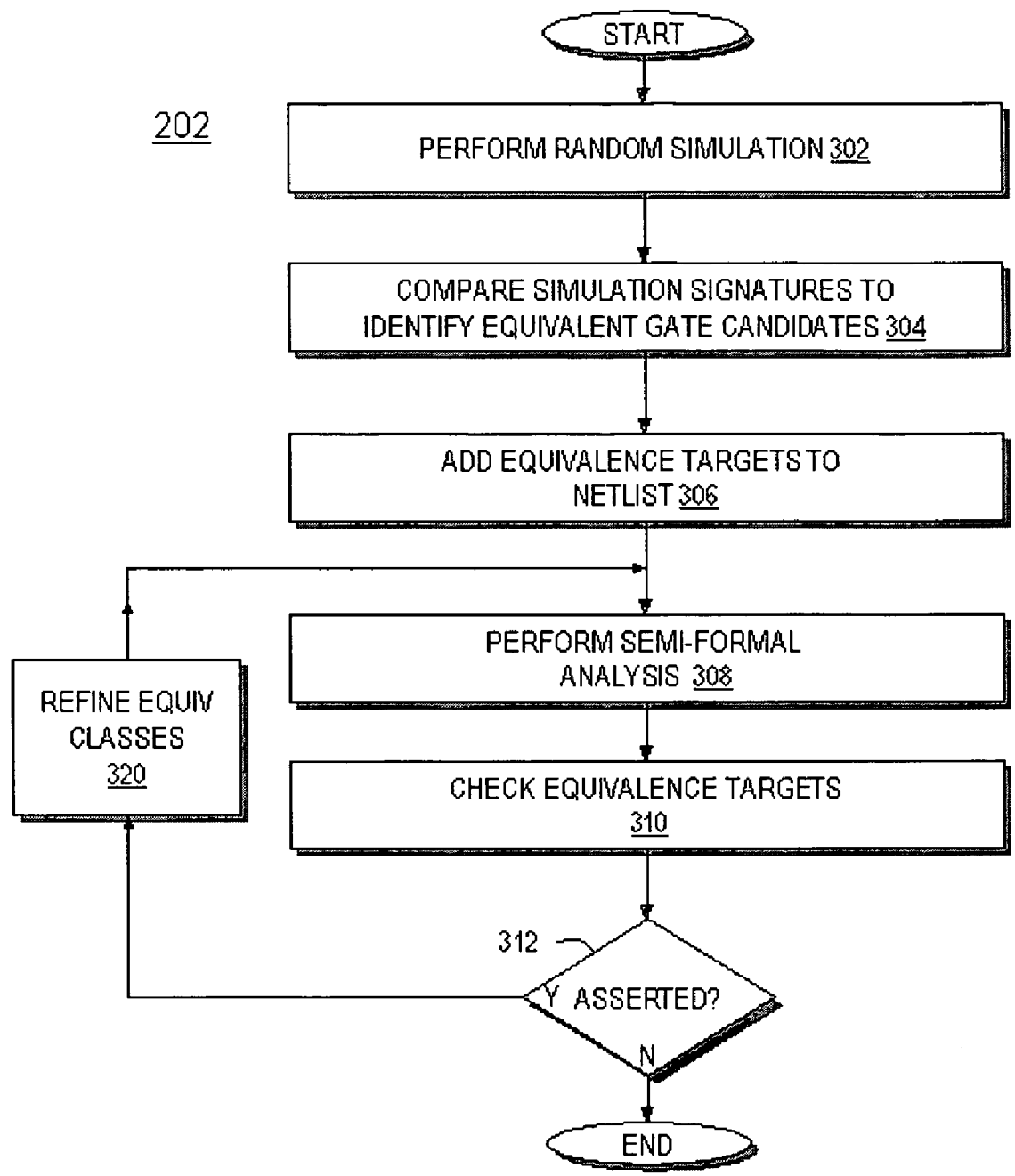
FIG. 3 is a flow diagram illustrating details of the identification of equivalence classes in the application of FIG. 2.

Referring to FIG. 3, a flow diagram depicts one implementation of equivalence class determination 202. In the depicted implementation, equivalence class determination 202 includes performing (block 302) random simulation on the original netlist to generate traces that include simulation signatures. The simulation signatures are the patterns of 1's and 0's associated with each gate in the netlist. The simulation signatures are compared (block 304) to one another to identify equivalent gate candidates. Equivalent gate candidates have the same simulation signature or a signature that is the logical inverse of another simulation signature. Thus, for example, a gate having a simulation signature of 1010110 would be an equivalent gate candidate with another gate exhibiting a 1010110 signature and with a third gate exhibiting a 0101001 signature. Each set of equivalent gate candidates is referred to as an equivalence class.

Figure 4:
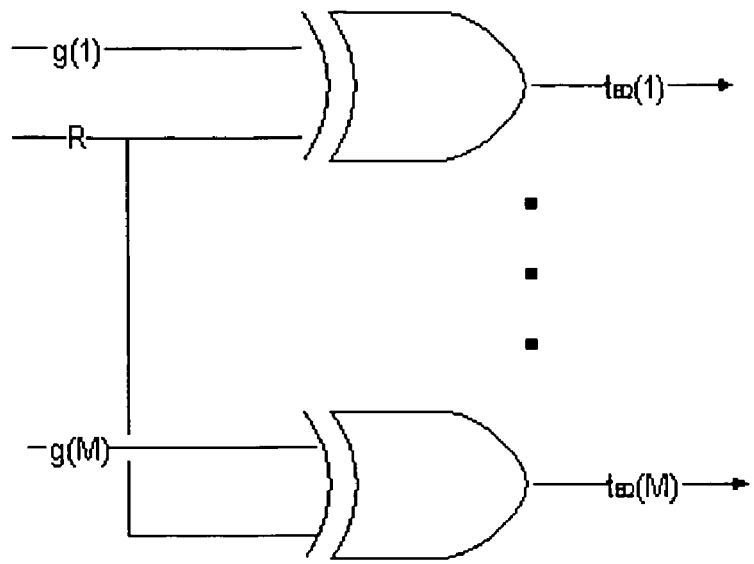
FIG. 4 illustrates the construction of equivalence targets as part of the application of FIG. 2.

After comparing the simulation results to identify one or more equivalence classes, equivalence targets are added (block 306) to the netlist. Equivalence targets are gates are indicative of the equivalence between two other gates. In the preferred embodiment, one of the gates in an equivalence class is designated as the representative and all other gates in the class are compared against the representative. In this embodiment, the equivalence targets are the outputs of XOR gates that are sourced by equivalent gate candidates g(1) through g(M) and the representative gate (R). FIG. 4 depicts the generation of M equivalence targets corresponding to M equivalent gate candidates. In this case, an equivalence target $t_{EQ}(x)$ is asserted only if the corresponding equivalent gate candidate g(x) differs from the representative gate R.

Figure 5:
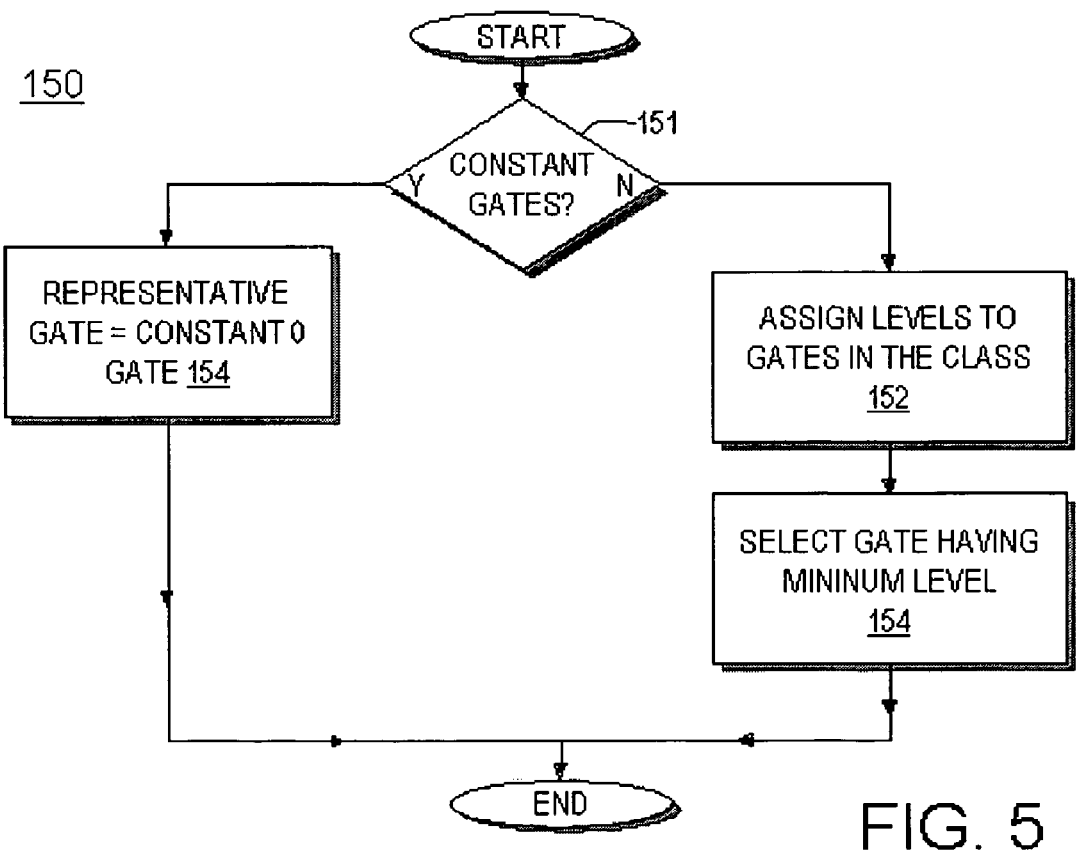
FIG. 5 is a flow diagram illustrating a method of selecting a representative gate from a collection of gates in a proposed equivalence class.

In one embodiment, identifying the representative gate for an equivalence class includes assigning of levels to each gate in the class. Referring to FIG. 5, a flow diagram 150 depicts a process for determining the representative gate in an equivalence class. Initially, if an equivalence class is identified (block 151) as a constant gate class, the representative gate is the constant 0 gate (block 154). For all other equivalence classes, each gate in the class is assigned (block 152) a numeric value referred to as a level. Constant gates, random gates, and registers are assigned a level of 0. For all other gates (i.e., combinational gates), the assigned level is L+1 where L is the maximum level value for all gates that source input edges to the combination gate. The representative gate having the lowest level is then selected (block 154) as the representative gate. In cases where two or more gates share the lowest level value in the class, the representative may be chosen randomly. Note that because a register always has a level of 0 and a combinational gate must have a level of at least 1, a combinational gate can be the representative gate only if there are no registers in the equivalence class.

Returning to FIG. 3, the proposed equivalence classes are refined using semiformal analysis (block 308) such as resource-bounded symbolic simulation for a small number of time steps. Following any such semiformal analysis, the equivalence targets are checked (block 310). If any of the equivalence targets are asserted (block 312), the equivalence classes are refined (block 320) by removing the candidate(s) corresponding to any asserted equivalence targets. The extend of semiformal analysis desirable to refine the equivalence classes is an implementation detail, but some minimal level of analysis is recommended to remove candidates that are trivially shown to be non-redundant.

Figure 6:
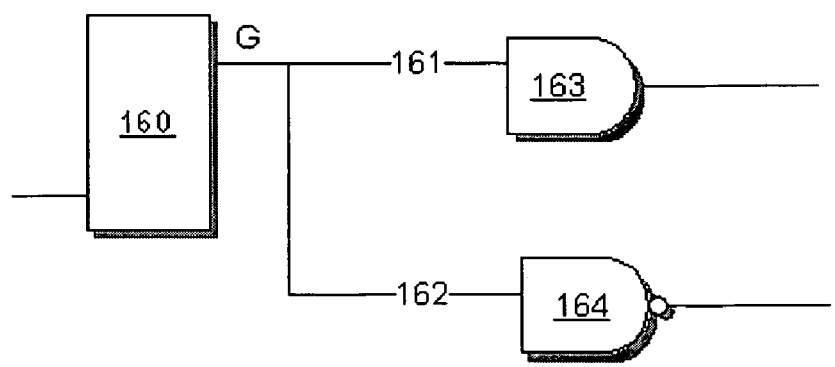
FIG. 6 depicts a candidate gate sourcing a pair of edges to illustrate the replacement of the candidate gate with a representative gate in the construction of a speculatively reduced netlist according to the present invention.

Returning to FIG. 2, having determined the initial equivalence classes, identified representative gates for each class, and added equivalence targets to the netlist, sequential redundancy removal application 120 generates (block 204) a speculatively reduced netlist. In the preferred embodiment, the speculatively reduced netlist is generated by replacing each instance of a gate G with the representative gate R, where G is an equivalence class candidate sourcing an edge in the original netlist. Referring to FIG. 6, a portion of a circuit model depicts a register 160 and a corresponding gate G. Gate G sources a first edge 161 connected to a first combinational element (AND gate) 163 and a second edge 162 connected to a second combinational element (NAND gate) 164. Assuming that gate G is a candidate gate in an equivalence class, a speculatively reduced netlist generated according to block 204 of FIG. 2 would replace gate G in the speculatively reduced netlist with the equivalence class's representative gate R as the source of edge 161 and 162 (this replacement is not depicted in FIG. 6).

Having generated the speculatively reduced netlist, sequential redundancy removal method 120 includes two different and substantially independent applications. In a first application 210, the speculatively reduced netlist is used to verify the proposed equivalence class(es) formally and thereby discharge the proof obligation necessary to merge the suspected redundancy. In a second application 220, the speculatively reduced netlist is used to obtain additional verification coverage without formally proving the correctness of the suspected equivalence.

Figure 7:
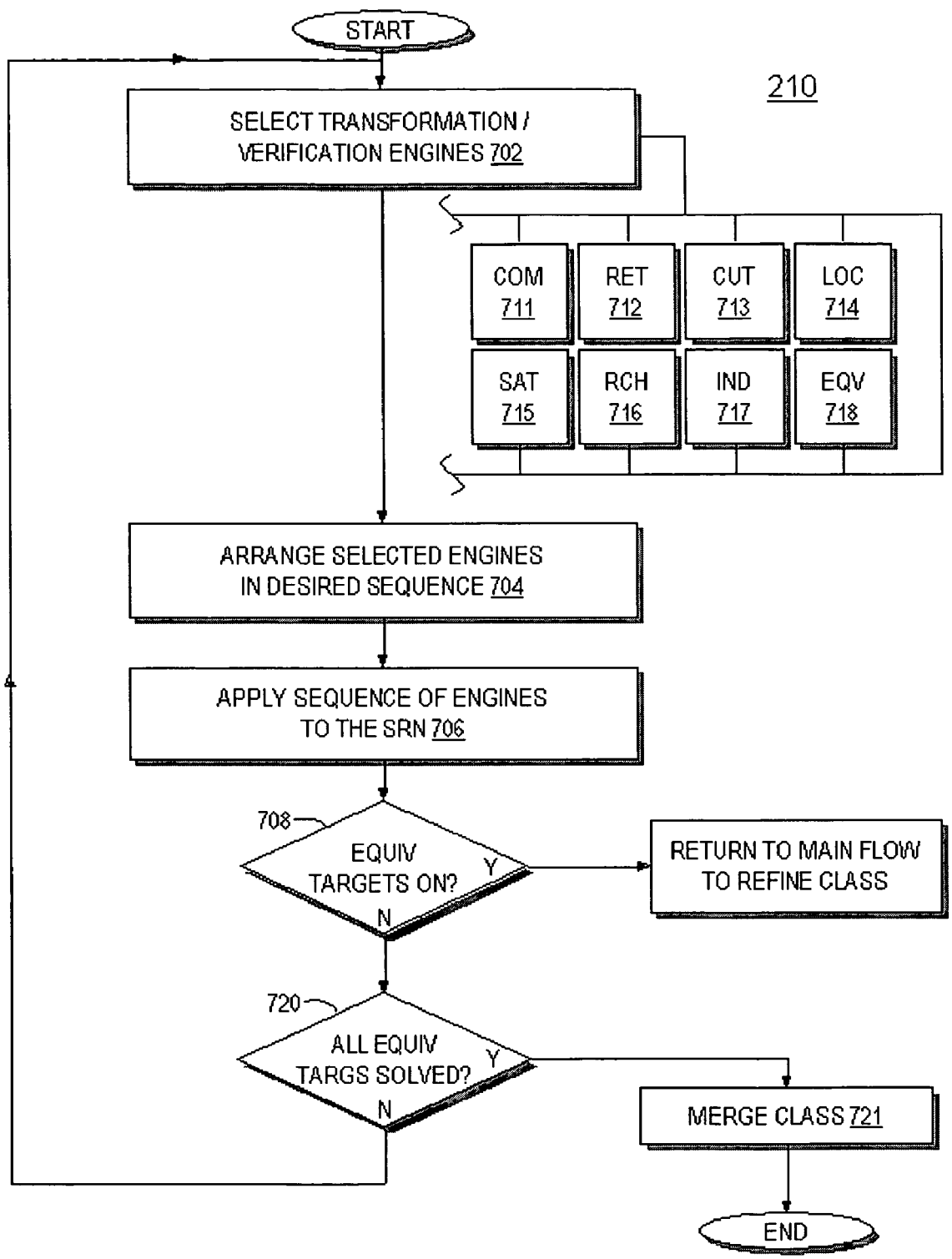
FIG. 7 is a flow diagram illustrating a first application of the present invention for proving formally the equivalence of a proposed equivalence class.

With regard to first application 210, the present invention includes functionality to prove the suspected equivalence formally by conclusively demonstrating that none of the equivalence targets can be asserted. In the preferred embodiment, first application 210 uses transformation based verification principles to apply a sequence of transformation engines to the speculatively reduced netlist. Referring to FIG. 7, a flow diagram illustrates selected details of an embodiment of the application 210 for demonstrating the correctness of a proposed equivalence class.

As depicted in FIG. 7, application 210 includes selecting (block 702) a set of transformation and verification algorithms (engines) to be applied to the speculatively reduced netlist. In the depicted embodiment, application 210 has access to a menu of transformation and verification engines 711-718 suitable for applying to the speculatively reduced netlist.

A combinational (COM) engine 711 is a redundancy removal engine that uses combinational techniques such as structural hashing and resource bounded BDD- and SAT-based analysis to identify gates that are functionally redundant across all time steps. A retiming engine (RET 712) is a minimum-area retiming engine that reduces the number of registers by shifting them across combinational gates. A re-encoding engine (CUT 713) is a range-preserving parametric re-encoding engine that replaces the fanin-side of a "cut" of the speculatively reduced netlist with a trace-equivalent, yet simpler, piece of logic. A localization engine (LOC 714) isolates a cut of the netlist local to the targets by replacing gates with primary inputs. LOC 714 is an over-approximate transformation, that uses a SAT-based refinement scheme to prevent spurious counterexamples.

A SAT solver (SAT 715) is an exhaustive verification engine that interleaves redundancy removal with BDD- and SAT-based analysis A symbolic reachability engine (716) and a SAT- and BDD-based induction engine (IND 717) provide additional verification functionality. The EQV engine 718 (also referred to herein as suspected redundancy engine 718) uses the techniques described in this disclosure for leveraging suspected, but unproved, redundancy to remove sequential redundancy. For example, one may use one or more of transformation/verification engines 711 through 717 during one iteration and, following completion, employ engine 718 to further transform the design. This embodiment of the invention emphasizes the varied uses of suspected redundancy engine 718 from exposing false candidate gates in an equivalence class to extending the minimum depth.

After selecting the transformation and verification engines desired, application 210 includes arranging (block 704) the selected engines in a desired sequence. An important benefit of application 210 is the ability to leverage independent algorithm flows to discharge certain equivalence targets. Different transformation and verification algorithms are better suited for different problems. As an example, for a circuit that has been retimed and resynthesized (a common design optimization procedure), polynomial resource retiming and redundancy removal engines can greatly simplify the problem and lead to trivial discharge of the equivalence target. Localization engines, as another example, are highly useful in resolving equivalence targets where only a portion of the circuit was redesigned. Accordingly, the preferred embodiment of application 210 permits user defined combinations and sequences of transformation and verification engines.

After defining a verification engine in block 704, application 210 includes applying (block 706) the defined sequence of engines to the speculatively reduced netlist. If (block 708) any equivalent targets are asserted during application of the defined sequence of engines, the method returns to main flow of FIG. 2 where, in blocks 230 and 232, the equivalence class is refined by removing the candidate corresponding to the asserted equivalence target.

Generally speaking, an equivalence class must be refined to separate the corresponding candidate from its representative whenever an equivalence target cannot be shown to be unreachable. There are two cases in which an equivalence target cannot be shown to be unreachable: an equivalence target is asserted (i.e., a trace is generated which differentiates the corresponding candidates), or an equivalence target cannot be solved within the available resource limits.

With respect to the case in which an equivalence target is asserted, it can be shown that a simulation trace asserting any of the equivalence targets in a speculatively-reduced model must differentiate at least one pair of redundancy candidates in the original design. Note, however, that the speculative merging may cause certain gates in the fanout of incorrectly-merged gates to either mismatch when they should not, or to not mismatch when they should. An effective way to determine precisely which candidates have been differentiated by the corresponding equivalence target-hitting trace is to simulate the original design with the input sequence that caused the speculatively reduced netlist to assert the target. Moreover, by additionally injecting random stimulus to any don't-cares associated with the trace and extending the sequential length of that trace, one may obtain a useful set of patterns suitable for refining all candidates.

If none of the equivalence targets is asserted, one or more of the equivalence targets may have been resolved by proving that the target is unreachable (can never be resolved). If (block 720) all equivalence targets across all equivalence classes have been resolved, each of the equivalence classes may then be merged (block 721). Merging, in this case, refers to replacing each instance of a candidate gate with an instance of the representative gate in the original netlist. If any targets in any equivalence class remain unresolved, application 210 may select and arrange a different sequence of engines and restart the process. This iterative looping may continue until all equivalence targets have been conclusively demonstrated.

It is theorized that the use of multiple independent transformation and verification engines in a modular setting results in greatly more efficient resolution of the equivalence targets. Moreover, the sequence of engines selected for application upon the speculatively reduced netlist may exclude any induction-based engines that are typically quite costly and yet frequently inconclusive because of the inclusion of unreachable states that is inherent in induction algorithms.

Figure 8:
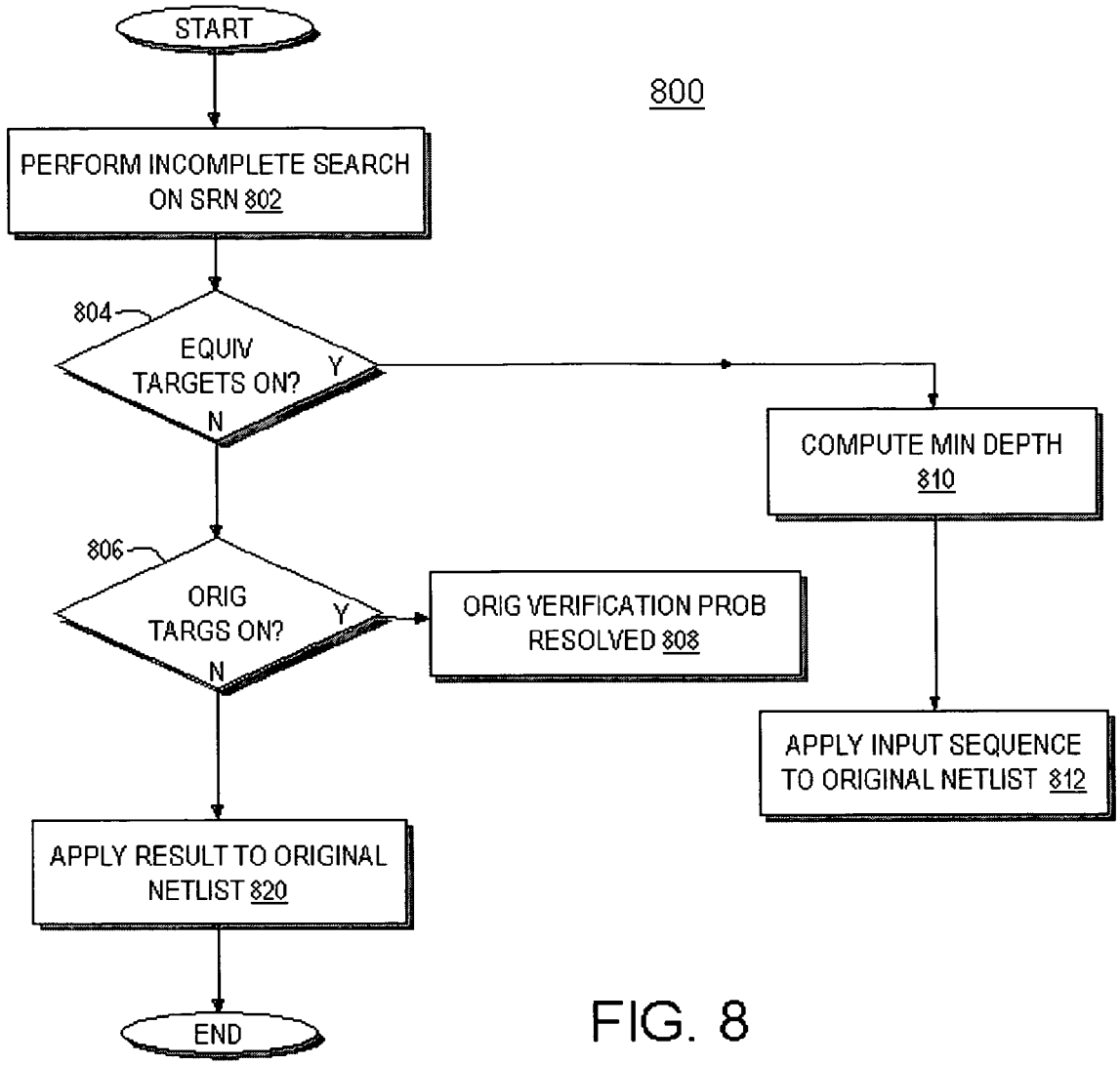
FIG. 8 is a flow diagram illustrating a second application of the present invention for using a speculatively reduced netlist to perform additional verification.

Referring now to FIG. 8, a flow diagram depicts an implementation of a method 800 for using speculatively reduced netlist according to the second application 220 of FIG. 2. In this embodiment, verification algorithms are applied to a speculatively reduced netlist that contains proposed, but as yet unproven, equivalence classes. Method 800 contemplates that it may be useful to exercise the unproven, speculatively reduced netlist as a means of discovering additional information about the design. For example, it can be conclusively demonstrated that, as long as the equivalence targets remain unasserted, any results obtained by the verification efforts applied to the speculatively reduced netlist are valid for the original design. Accordingly, method 800 contemplates using the speculatively reduced netlist, without requiring formal proof, to obtain additional verification coverage that may then be applied to the original netlist as long as the equivalence targets remain unasserted. These applications transform the equivalence targets from a role of assumption checkers for redundancy removal proofs to filters used to confirm that any analysis performed on the speculatively reduced netlist is applicable to the original netlist. The applications for using method 800 are sometimes referred to herein as falsification applications.

For example, if we apply a sequence of test vectors to both models, and none of the miters in the speculatively-reduced model are asserted during that simulation, a target in the reduced model will be asserted if and only if that target is asserted in the original de-sign under that simulation. This observation in turn implies that any number of symbolic evaluation steps, whether exact or under-approximate, performed without asserting any of the miters preserves the results obtained upon the targets during that analysis.

This result allows the present invention to exploit even redundancy that holds only for an initial bounded time-frame, but not across all time-frames, to leverage the speculatively-reduced model for applications such as increasing the depth to which bounded falsification may be performed on the targets. This result also allows us to construct and use the speculatively-reduced model in alternative proof-incapable frameworks such as simulators and hardware emulators.

As examples, many cases may be found where one could perform bounded falsification on targets many times faster, and also deeper, on the speculatively-reduced model than on the original design. Second, this approach is useful in the refining the process of guessing equivalence classes. After preliminarily positing an equivalence class based on low-cost analysis of the original design (e.g., random simulation with some low cost formal analysis), a speculatively-reduced model is built. A sequence of transformations is then applied to further reduce that model, and then apply more extensive semi-formal analysis on that reduced model to further attempt to differentiate the candidates.

A third application allows one to reuse the knowledge that gates a and b cannot be differentiated for times 0 through i across equivalence class refinements. In particular, if the equivalence class containing gates a and b is unaltered, we may immediately infer that the XOR of a and b cannot be asserted for times 0 through i regardless of the refinement of any other equivalence classes. Moreover, if one refines the equivalence class containing gates a, b, c, and d (because an equivalence target in this class was asserted in time step i), and the refinement results in equivalence targets (a XOR c) in a first class and (b XOR d) in a second class, one may immediately infer that these two new equivalence targets cannot be asserted for times 0 through i. This optimization holds because refinements only split a class into several new classes, but never group gates from previously-incompatible classes.

Practically, this application serves two goals. First, it enables one to reuse the discharging of the induction hypothesis from prior proof attempts to speed up later ones. Second, one may wish to intermix semi-formal analysis to assert equivalence targets with proof analysis to demonstrate their unreachability; this optimization helps reuse falsification effort across refinements.

It is noted that one need not re-prove any equivalence targets that had no refined gates in their fanin cones because the prior proof is guaranteed valid after the refinement. We may extend our third application to generalize that of by noting that the assertion of a equivalent of gate a and the representative gate of the equivalence class of gate a, at time i, only risks invalidating results beyond time i for equivalence classes that contain a in their fanin cones.

Method 800 as depicted in FIG. 8 includes performing (block 802) incomplete search. The incomplete search may include random simulation, emulation, symbolic simulation, and semiformal search. For example, symbolic simulation on a speculatively reduced netlist having two equivalence targets may indicate that the first equivalence target cannot be asserted for time steps 0 through 5 while the second equivalence target cannot be asserted for time steps 0 through 7. These results inform the user that the original targets cannot be asserted in time steps 0 through 5.

As another example, when doing explicit search such as simulation, all evaluation performed before asserting any of the sub-targets is valid with respect to the original design. Thus, if explicit simulation or emulation of 10000 does not yield an asserted first equivalence target for 9980 steps and an asserted second equivalence target for 9650, one can infer that the original targets are not hit in the first 9650 steps along the explicit path taken. Conversely, the assertion of any target during the incomplete search reflects a valid assertion of the corresponding gate.

Thus, method 800 of FIG. 8 includes a determination (block 804) of whether any equivalent targets are asserted. If any targets are asserted, the depicted embodiment of application 220 includes computing (block 810) a minimum depth associated with the verification processing of block 802. As indicated in the preceding paragraph, the minimum depth might be the first time step of a symbolic simulation or an explicit simulation during which an equivalence target is asserted. In addition, method 800 may include applying the input sequence of an explicit or symbolic sequence (block 812) that produced an asserted equivalence target to the original netlist in an effort to yield the assertion of additional targets. Thereafter, method 800 may return to the main application 120 of FIG. 2, where refinement (block 232) of any equivalence class exhibiting an asserted equivalence gate.

FIG. 8 also illustrates the determination (block 806) of whether any original target was asserted. If original targets are asserted in the speculatively reduced netlist after performing the additional verification represented by block 802 when no equivalent targets are asserted, the assertion of the original targets represents a valid assertion of the appropriate target. The assertion of an original target might equate to formal discharge of the verification problem (e.g., if the original target is a CHECKSTOP signal). Method 800 as depicted in FIG. 8 also indicates generally that any results obtained by performing the incomplete search 802 are validly applied to the original netlist when none of the equivalence checkstops are asserted.

It will be apparent to those skilled in the art having the benefit of this disclosure that the present invention contemplates a mechanism for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A verification method suitable for use with an original model of an integrated circuit, the original model being described by a netlist including a set of gates and a set of edges representing interconnections between the gates, comprising:

proposing, as an equivalence class, a set of candidate gates suspected of exhibiting equivalent behavior;

selecting one of the candidate gates as a representative gate;

creating a set of equivalence gates, wherein such an equivalence gate comprises an XOR or XNOR sourced by the representative gate and a respective one of the candidate gates;

substituting the output of the representative gate for the outputs of the candidate gates;

applying a plurality of transformation engines to the netlist having the substituted representative gate output, in order to eliminate gates and, thereby, create a speculatively reduced netlist; and producing predetemined logic states of gates in the speculatively reduced netlist other than the equivalence gates responsive to applying a selected series of logic signals to the speculatively reduced netlist, wherein the produced logic states indicate verification coverage and the verification coverage is deemed valid if none of the equivalence gates change logic state responsive to the application of the selected series of logic signals.

2. The method of claim 1, wherein the proposing an equivalence class includes:

performing random simulation on the original model and comparing simulation signatures generated during the simulation to generate a preliminary equivalence class; and performing semi-formal analysis on the preliminary equivalence class to refine the preliminary equivalence class by removing at least some candidates.

3. The method of claim 1, wherein the selecting one of the candidate gates as the representative gate comprises:

assigning a level to each candidate gate, wherein the level for a constant gate, random gate, or sequential gate is 0 and wherein the level for a combinational gate is one greater than the lowest level of a gate that sources an edge connected to the combinational gate; and selecting as the representative, the gate having the lowest level.

4. The method of claim 1, wherein applying the plurality of transformation engines includes applying an engine selected from a retiming engine, a localization engine, and a parametric re-encoding engine, and a suspected redundancy engine.

5. The method of claim 4, wherein applying the plurality of transformation engines includes applying a first plurality of the transformation engines to prove a first equivalence target unreachable and applying a second plurality of the transformation engines to prove a second equivalence target unreachable wherein in the first and second plurality of transformation engines differ in number or sequence.

6. The method of claim 1, wherein producing the predetermined logic states of gates in the speculatively reduced netlist includes applying a process selected from the group consisting of random simulation, emulation, symbolic simulation, and semi-formal analysis.

7. The method of claim 1, further comprising, refining the equivalence class containing one of the equivalence gates if one of the equivalence gates changes logic state responsive to the application of the selected series ot logic signals.

8. The method of claim 7, further comprising, following refining the equivalence class, repeating the method of claim 1 using the refined equivalence class.

9. The method of claim 1, further comprising computing a minimum depth representing the number of time steps during which the equivalence targets are unasserted.

10. The method of claim 1, responsive to any of the equivalence gates being asserted during the transformation process, using the corresponding input sequence that asserts the equivalence gates to randomly simulate the original netlist to yield an assertion of other equivalence gates and/or original targets.

11. A computer program product stored on a tangible, computer readable medium for verifying an original model of an integrated circuit, the original model being described by a netlist including a set of gates and a set of edges representing interconnections between the gates, said computer program product having instructions for execution by a computer, which, when executed by the computer, cause the computer to implement a method comprising the steps of:

proposing, as an equivalence class candidate gates suspected of exhibiting equivalent behavior;

selecting one of the candidate gates as a representative gate;

creating a set of equivalence gates, wherein such an equivalence gate comprises an XOR or XNOR sourced by the representative gate and a respective one of the candidate gates;

substituting the output of the representative gate for the outputs of the candidate gates; and applying a plurality of transformation engines to the netlist having the substituted representative gate output, in order to eliminate gates and, thereby, create a speculatively reduced netlist; and producing predetermined logic states of gates in the speculatively reduced netlist other than the equivalence gates responsive to applying a selected series of logic signals to the speculatively reduced netlist, wherein the produced logic states indicate verification coverage and the verification coverage is deemed valid if none of the equivalence gates change logic state responsive to the application of the selected series of logic signals.

12. The computer program product of claim 11, wherein the proposing an equivalence class includes:

performing random simulation on the original model and comparing simulation signatures generated during the simulation to generate a preliminary equivalence class; and performing semi-formal analysis on the preliminary equivalence class to refine the preliminary equivalence class by removing at least some candidates.

13. The computer program product of claim 11, wherein the selecting one of the candidate gates as the representative gate comprises:

assigning a level to each candidate gate, wherein the level for a constant gate, random gate, or sequential gate is 0 and wherein the level for a combinational gate is one greater than the lowest level of a gate that sources an edge connected to the combinational gate; and selecting as the representative, the gate having the lowest level.

14. The computer program product of claim 11, wherein the applying the plurality of transformation engines includes computer code means for applying an engine selected from a retiming engine, a localization engine, and a parametric re-encoding engine, and a suspected redundancy engine.

15. The computer program product of claim 14, wherein the applying the plurality of transformation engines includes applying a first plurality of the transformation engines to prove a first equivalence target unreachable and applying a second plurality of the transformation engines to prove a second equivalence target unreachable wherein in the first and second plurality of transformation engines differ in number or sequence.

16. The computer program product of claim 11, wherein the producing the predetermined logic states of gates in the speculatively reduced netlist includes applying a process selected from the group consisting of random simulation, emulation, symbolic simulation, and semi-formal analysis.

17. The computer program product of claim 11, further comprising, refining the equivalence class containing one of the equivalences gates if the one of the equivalence gates changes logic state responsive to the application of the selected series of logic signals.

18. The computer program product of claim 17, further comprising repeating steps of of claim 11 using the refined equivalence classes.

19. A verification system including processor, system memory, and storage, comprising;
- means for proposing, an equivalence class, a set of candidate gates suspected of exhibiting equivalent behavior;
- means for selecting one of the candidate gates as a representative gate for the equivalence class;
- means for creating a set equivalence gates, wherein such an equivalence gate comprises an XOR or XNOR sourced by the representative gate and a respective one of the candidate gates;
- means for substituting the representative gate for the outputs of the candidate gate; and
- means for applying a plurality of transformation engines to the netlist having the substituted representative gate output, in order to eliminate gates and, thereby, create a speculatively reduced netlist; and
- means for producing predetermined logic states of gates in the speculatively reduced netlist other than the equivalence gates reponsive to appyling a selected series of logic signals to the speculatively reduced netlist, wherein the produced logic states indicate verification coverage and the verification coverage is deemed valid if none of the equivalence gates changed logic state responsive to the application of the selected series of logic signals.

20. The system of claim 19, wherein the means for applying the plurality of transformation engines includes means for applying an engine selected from a retiming engine, a localization engine, and a parametric re-encoding engine, and a suspected redundancy engine and wherein the means for producing the states of gates in the speculatively reduced netlist includes means for applying a process selected from the group consisting of random simulation, emulation, symbolic simulation, and semi-formal analysis.

* * * * *